United States Patent
Nam et al.

(10) Patent No.: US 12,010,255 B2
(45) Date of Patent: Jun. 11, 2024

(54) PLURALITY OF ANTENNAS AND ELECTRONIC DEVICE COMPRISING SAME

(71) Applicant: Samsung Electronics Co., Ltd., Suwon-si (KR)

(72) Inventors: Hojung Nam, Suwon-si (KR); Junwoo Kim, Suwon-si (KR); Chankyu An, Suwon-si (KR); Sungkoo Park, Suwon-si (KR); Cheolhong Son, Suwon-si (KR); Soonho Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 245 days.

(21) Appl. No.: 17/430,222

(22) PCT Filed: Feb. 18, 2020

(86) PCT No.: PCT/KR2020/002313
§ 371 (c)(1),
(2) Date: Aug. 11, 2021

(87) PCT Pub. No.: WO2020/171539
PCT Pub. Date: Aug. 27, 2020

(65) Prior Publication Data
US 2022/0166867 A1 May 26, 2022

(30) Foreign Application Priority Data
Feb. 19, 2019 (KR) .......................... 10-2019-0019569

(51) Int. Cl.
*H04M 1/02* (2006.01)
*H01Q 1/24* (2006.01)
(Continued)

(52) U.S. Cl.
CPC .......... *H04M 1/0277* (2013.01); *H01Q 1/242* (2013.01); *H05K 1/0237* (2013.01); *H05K 7/1427* (2013.01)

(58) Field of Classification Search
CPC .................................................. H04M 1/0277
See application file for complete search history.

(56) References Cited

U.S. PATENT DOCUMENTS

| 9,608,314 | B1 | 3/2017 | Kwon et al. |
| 9,728,854 | B2 | 8/2017 | Kim et al. |

(Continued)

FOREIGN PATENT DOCUMENTS

| CN | 105609969 A | 5/2016 |
| CN | 105932408 A | 9/2016 |

(Continued)

OTHER PUBLICATIONS

Extended European Search Report dated Feb. 21, 2022, issued in European Patent Application No. 20758954.0.
(Continued)

*Primary Examiner* — Hsinchun Liao
(74) *Attorney, Agent, or Firm* — Jefferson IP Law, LLP

(57) ABSTRACT

An electronic device is provided. The electronic device includes a housing including a first plate, a second plate, and a side member, a metal structure of which a part is connected to the side member, and a printed circuit board. The side member includes a first conductive portion, a second conductive portion, a third conductive portion, a first segment formed between the first conductive portion and the second conductive portion, and a second segment formed between the first conductive portion and the third conductive portion. The first conductive portion is connected to a first ground part disposed on the printed circuit board through a first path, and is connected to a second ground part disposed on (Continued)

<501>

<503> the metal structure through a second path spaced from the first path by a specific distance.

10 Claims, 13 Drawing Sheets

(51) Int. Cl.
  *H05K 1/02* (2006.01)
  *H05K 7/14* (2006.01)

(56) References Cited

U.S. PATENT DOCUMENTS

| | | | |
|---|---|---|---|
| 9,762,710 | B2 | 9/2017 | Lee et al. |
| 10,015,294 | B2 | 7/2018 | Lee et al. |
| 10,305,166 | B2 | 5/2019 | Kim et al. |
| 10,516,772 | B2 | 12/2019 | Lee et al. |
| 10,623,028 | B2 | 4/2020 | Kim et al. |
| 10,651,542 | B2 | 5/2020 | Choi et al. |
| 10,741,904 | B2 | 8/2020 | Kim et al. |
| 10,951,260 | B2 | 3/2021 | Jung et al. |
| 11,050,863 | B2 | 6/2021 | Lee et al. |
| 11,570,286 | B2 | 1/2023 | Lee et al. |
| 2004/0130493 | A1* | 7/2004 | Horita ............... H01Q 5/371 343/702 |
| 2013/0234911 | A1 | 9/2013 | Lee |
| 2016/0064820 | A1 | 3/2016 | Kim et al. |
| 2016/0233574 | A1* | 8/2016 | Xiong ............... H01Q 1/2258 |
| 2017/0005393 | A1* | 1/2017 | Wu ............... H01Q 1/243 |
| 2017/0047637 | A1 | 2/2017 | Kim et al. |
| 2017/0201016 | A1 | 7/2017 | Kwon et al. |
| 2018/0301787 | A1 | 10/2018 | Han et al. |
| 2020/0162591 | A1 | 5/2020 | Jung et al. |
| 2020/0194872 | A1 | 6/2020 | Han et al. |
| 2020/0274229 | A1 | 8/2020 | Choi et al. |
| 2021/0028536 | A1 | 1/2021 | Han et al. |
| 2021/0175922 | A1 | 6/2021 | Jung et al. |

FOREIGN PATENT DOCUMENTS

| | | |
|---|---|---|
| CN | 106450662 A | 2/2017 |
| CN | 107851887 A | 3/2018 |
| CN | 108832296 A | 11/2018 |
| KR | 10-2013-0102170 A | 9/2013 |
| KR | 10-2016-0027700 A | 3/2016 |
| KR | 10-2017-0097396 A | 8/2017 |
| KR | 10-2017-0111484 A | 10/2017 |
| KR | 10-2018-0016921 A | 2/2018 |
| KR | 10-2018-0027802 A | 3/2018 |
| KR | 10-2018-0092226 A | 8/2018 |
| WO | 2018/139692 A1 | 8/2018 |
| WO | 2019/009441 A1 | 1/2019 |

OTHER PUBLICATIONS

Korean Office Action dated Feb. 16, 2023, issued in Korean Patent Application No. 10-2019-0019569.
Korean Notice of Allowance dated Aug. 22, 2023, issued in Korean Patent Application No. 10-2019-0019569.
Chinese Office Action dated Nov. 22, 2023, issued in Chinese Patent Application No. 202080015485.5.
Chinese Notice of Allowance dated Apr. 19, 2024, issued in Chinese Patent Application No. 202080015485.5.

* cited by examiner

PLURALITY OF ANTENNAS AND ELECTRONIC DEVICE COMPRISING SAME

CROSS-REFERENCE TO RELATED APPLICATION(S)

This application is a U.S. National Stage application under 35 U.S.C. § 371 of an International application number PCT/KR2020/002313, filed on Feb. 18, 2020, which is based on and claims priority of a Korean patent application number 10-2019-0019569, filed on Feb. 19, 2019, in the Korean Intellectual Property Office, the disclosure of which is incorporated by reference herein in its entirety.

BACKGROUND

1. Field

The disclosure relates to an electronic device including a plurality of antennas.

2. Description of Related Art

With the development of mobile communication technologies, an electronic device is capable of freely connecting to a wireless/wired network making it easily portable. For example, because a portable electronic device such as a smartphone, a tablet personal computer (PC), or the like includes a plurality of antennas for transmitting and receiving wireless signals, the portable electronic device may connect to a wireless communication network.

The above information is presented as background information only to assist with an understanding of the disclosure. No determination has been made, and no assertion is made, as to whether any of the above might be applicable as prior art with regard to the disclosure.

SUMMARY

The number of frequency bands required to provide various services using wireless communication may increase. To this end, an electronic device may include a plurality of antennas. However, when a plurality of antennas are implemented in a limited area, it is difficult to secure isolation between antennas, and thus radiation performance may be reduced due to interference between antennas. In addition, it is difficult to optimize resonance formation in a desired frequency band.

Aspects of the disclosure are to address at least the above-mentioned problems and/or disadvantages and to provide at least the advantages described below. Accordingly, an aspect of the disclosure is to provide an electronic device including a structure for physically separating a ground part corresponding to a plurality of antennas included in one antenna radiator in an electronic device having a plurality of antennas.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first plate, a second plate facing away from the first plate, and a side member surrounding a space between the first plate and the second plate, a metal structure of which a part is connected to the side member, and a printed circuit board positioned between the metal structure and the second plate. The side member may include a first conductive portion, a second conductive portion extending from one end of the first conductive portion, a third conductive portion extending from the other end of the first conductive portion, a first segment formed between the first conductive portion and the second conductive portion, and a second segment formed between the first conductive portion and the third conductive portion. The first conductive portion may be connected to a first ground part disposed on the printed circuit board through a first path, and is connected to a second ground part disposed on the metal structure through a second path spaced from the first path by a specific distance.

In accordance with another aspect of the disclosure, an electronic device is provided. The electronic device includes a housing including a first plate, a second plate facing away from the first plate, and a side member surrounding a space between the first plate and the second plate, a metal structure of which a part is connected to the side member, and a printed circuit board positioned between the metal structure and the second plate. The side member may include a first conductive portion, a second conductive portion extending from one end of the first conductive portion, a third conductive portion extending from the other end of the first conductive portion, a first segment formed between the first conductive portion and the second conductive portion, and a second segment formed between the first conductive portion and the third conductive portion. The first conductive portion may be connected to a first ground part disposed on the printed circuit board, and a second ground part disposed on the metal structure. The first ground part may be disposed closer to the second plate than the second ground part.

According to the embodiments disclosed in this specification, in an electronic device including a plurality of antennas, it is possible to secure the performance of each of a plurality of antennas included in one antenna radiator.

Besides, a variety of effects directly or indirectly understood through the specification may be provided.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
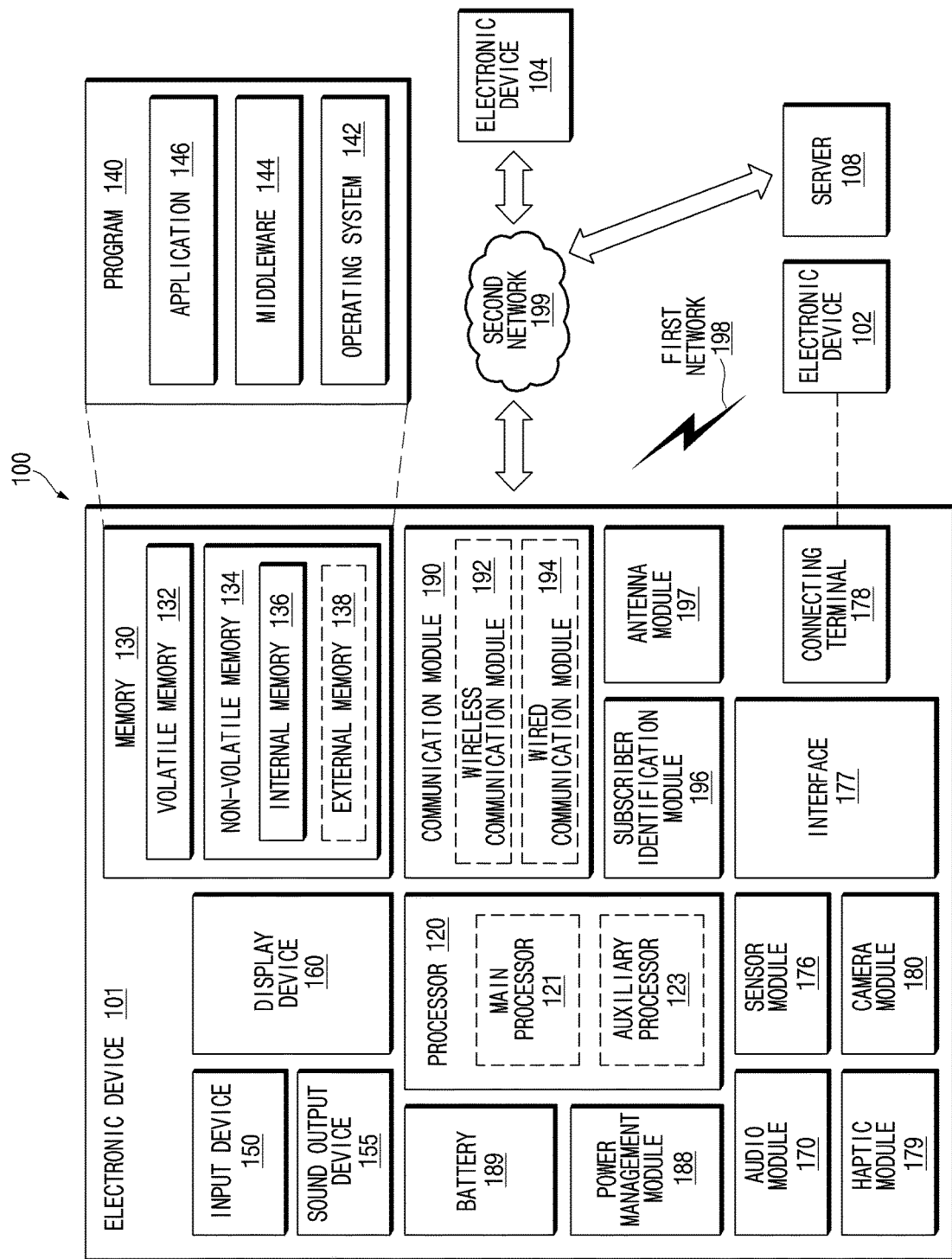
FIG. 1 is a block diagram illustrating an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wired) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wired) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
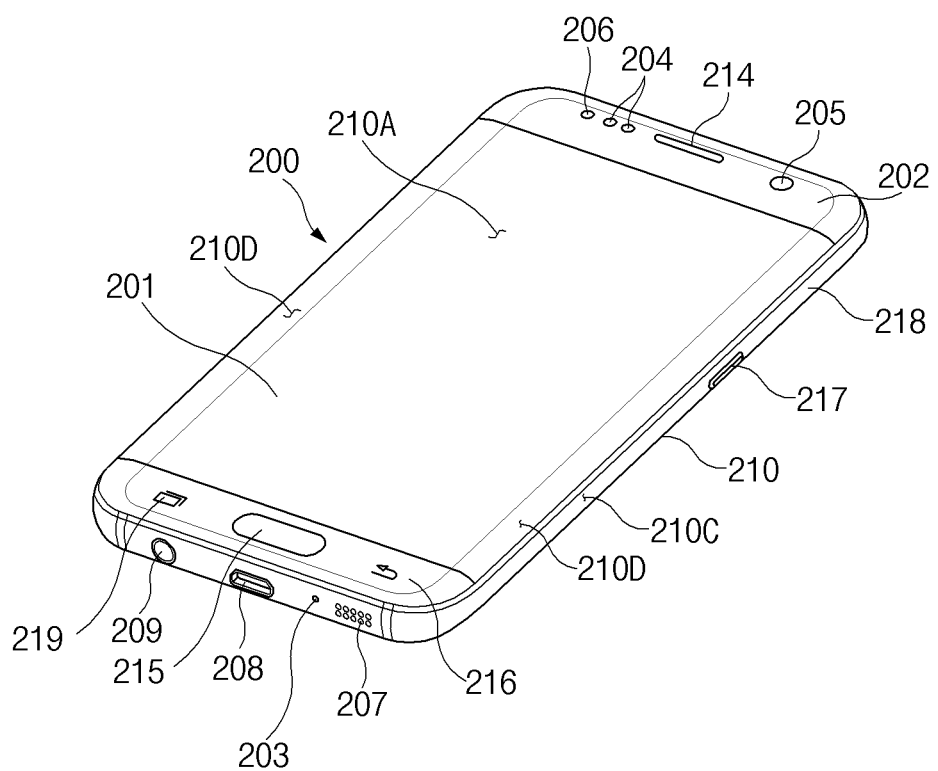
FIG. 2A is a front perspective view of a mobile electronic device according to an embodiment of the disclosure.

FIG. 2A is a front perspective view of a mobile electronic device according to an embodiment of the disclosure.

Figure 2B:
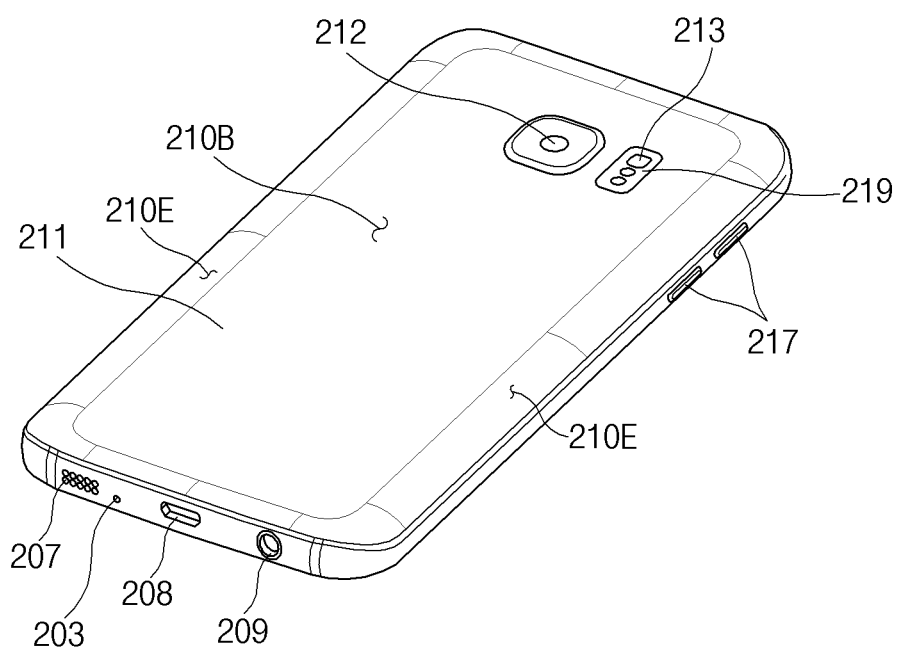
FIG. 2B is a back perspective view of an electronic device of FIG. 2A according to an embodiment of the disclosure.

FIG. 2B is a back perspective view of an electronic device of FIG. 2A according to an embodiment of the disclosure.

Referring to FIGS. 2A and 2B, an electronic device 200 according to an embodiment may include a housing 210 including a first surface (or a front surface) 210A, a second surface (or a back surface) 210B, and a side surface 210C surrounding a space between the first surface 210A and the second surface 210B. In another embodiment (not illustrated), the housing may refer to a structure that forms a part of the first surface 210A, the second surface 210B, and side surfaces 210C of FIG. 2A. According to an embodiment, the first surface 210A may be implemented with a front plate 202 (e.g., a glass plate including various coating layers, or a polymer plate), at least part of which is substantially transparent. The second surface 210B may be formed by a rear plate 211 that is substantially opaque. For example, the rear plate 211 may be implemented with a coated or colored glass, a ceramic, a polymer, a metal (e.g., aluminum, stainless steel (STS), or magnesium), or the combination of at least two of the above-described materials. The side surface 210C may be coupled to the front plate 202 and the rear plate 211, and may be formed by a side bezel structure (or a "side member") 218 including a metal and/or a polymer. In an embodiment, the rear plate 211 and the side bezel structure 218 may be integrally formed and may include the same material (e.g., a metal material such as aluminum).

In the embodiment that is illustrated, the front plate 202 may include two first regions 210D, which are bent toward the rear plate 211 from the first surface 210A so as to be seamlessly extended, at opposite long edges of the front plate 202. In the embodiment (refer to FIG. 2B) that is illustrated, the rear plate 211 may include two second regions 210E, which are bent toward the front plate 202 from the second surface 210B so as to be seamlessly extended, at opposite long edges thereof. In an embodiment, the front plate 202 (or the rear plate 211) may include only one of the first regions 210D (or the second regions 210E). In another embodiment, a portion of the first regions 210D or the second regions 210E may not be included. In the embodiments, when viewed from a side surface of the electronic device 200, the side bezel structure 218 may have a first thickness (or width) on one side where the first regions 210D or the second regions 210E are not included, and may have a second thickness, which is smaller than the first thickness, on one side where the first regions 210D or the second regions 210E are included.

According to an embodiment, the electronic device 200 may include at least one or more of a display 201, an audio module (203, 207, 214), a sensor module (204, 219), a camera module (205, 212, 213), a key input device (215, 216, 217), an indicator 206, and a connector hole (208, 209). In any embodiment, the electronic device 200 may not include at least one (e.g., the key input device (215, 216, 217) or the indicator 206) of the components or may further include any other component.

For example, the display 201 may be exposed through a substantial portion of the front plate 202. In an embodiment, at least part of the display 201 may be exposed through the first surface 210A and the front plate 202 forming the first regions 210D of the side surface 210C. The display 201 may be coupled to a touch sensing circuit, a pressure sensor capable of measuring the intensity (or pressure) of a touch, and/or a digitizer detecting a magnetic stylus pen or may be disposed adjacent thereto. In an embodiment, at least part of the sensor module (204, 219) and/or at least part of the key input device (215, 216, 217) may be disposed in the first regions 210D and/or the second regions 210E.

The audio module (203, 207, 214) may include the microphone hole 203 and the speaker hole (207, 214). The microphone for obtaining external sound may be disposed within the microphone hole 203; in an embodiment, a plurality of microphones may be disposed to detect a direction of sound. The speaker hole (207, 214) may include the external speaker hole 207 and the receiver hole 214 for making a call. In an embodiment, the speaker hole (207, 214) and the microphone hole 203 may be implemented with one hole, or a speaker (e.g., a piezoelectric speaker) may be included without the speaker hole (207, 214).

The sensor module (204, 219) may generate an electrical signal or a data value corresponding to an internal operation state of the electronic device 200 or corresponding to an external environment state. The sensor module (204, 219) may include, for example, the first sensor module 204 (e.g., a proximity sensor) and/or a second sensor module (not illustrated) (e.g., a fingerprint sensor) positioned on the first surface 210A of the housing 210, and/or the third sensor module 219 (e.g., a hear rate monitor (HRM) sensor) positioned on the second surface 210B of the housing 210. The fingerprint sensor may be disposed on the second surface 210B as well as the first surface 210A (e.g., the home key button 215) of the housing 210. The electronic device 200 may further include a sensor module not illustrated, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or the illumination sensor 204.

The camera module (205, 212, 213) may include the first camera device 205 disposed on the first surface 210A of the electronic device 200, and the second camera device 212 and/or the flash 213 disposed on the second surface 210B. The camera devices 205 and 212 may include one or more lenses, an image sensor, and/or an image signal processor. The flash 213 may include, for example, a light-emitting diode or a xenon lamp. In an embodiment, two or more lenses (e.g., an infrared camera and wide-angle and telephoto lenses) and image sensors may be disposed on one surface of the electronic device 200.

The key input device (215, 216, 217) may include the home key button 215 disposed on the first surface 210A of the housing 210, the touch pad 216 disposed in the vicinity of the home key button 215, and/or the side key button 217 disposed on the side surface 210C of the housing 210. In another embodiment, the electronic device 200 may not include all or a part of the aforementioned key input device (215, 216, 217), and the key input device (215, 216, 217) not included may be implemented in the form of a soft key on the display 201.

The indicator 206 may be positioned, for example, on the first surface 210A of the housing 210. The indicator 206 may provide state information of the electronic device 200, for example, in the form of light, and may include an LED.

The connector hole (208, 209) may include the first connector hole 208 that is capable of accommodating a connector (e.g., a USB connector) for transmitting/receiving a power and/or data with an external electronic device, and/or the second connector hole (or an earphone jack) 209 that is capable of accommodating a connector for transmitting/receiving an audio signal with the external electronic device.

Figure 3:
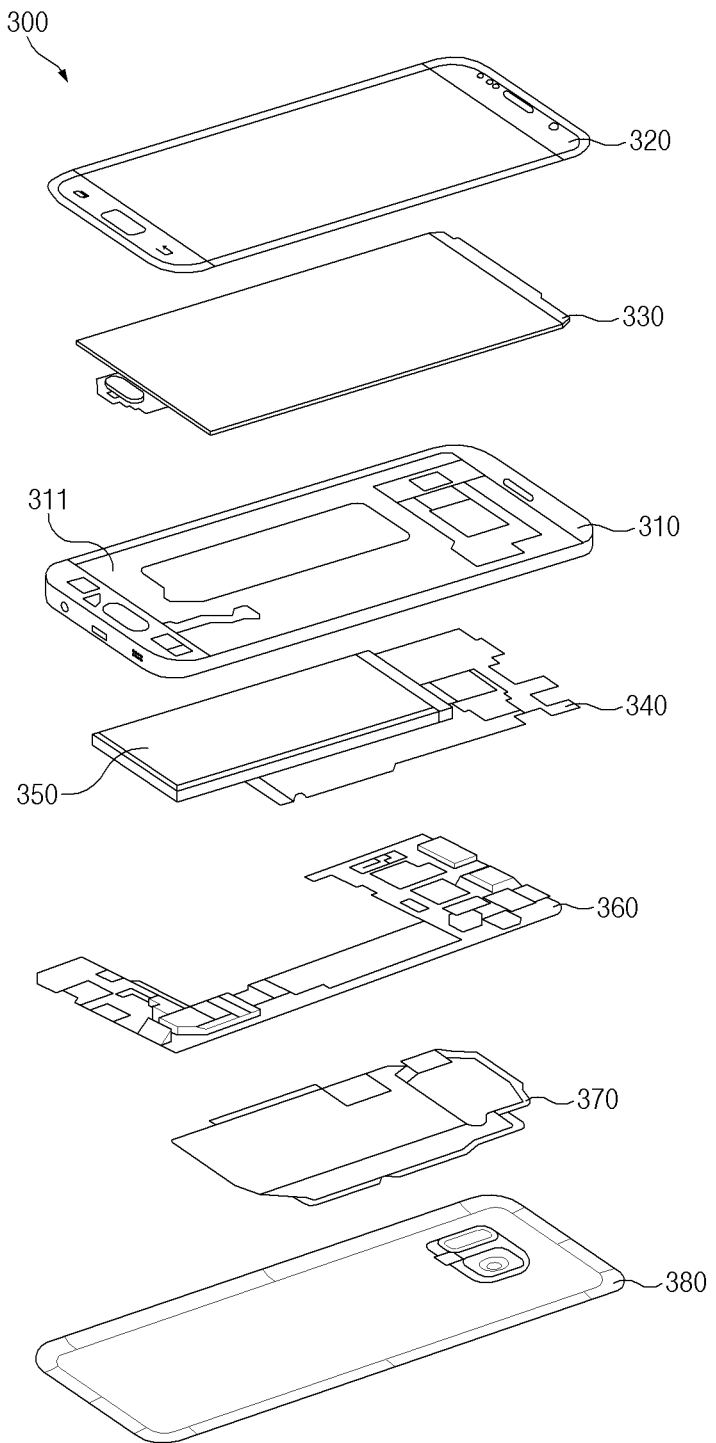
FIG. 3 is an exploded perspective view of an electronic device of FIGS. 2A and 2B according to an embodiment of the disclosure.

FIG. 3 is an exploded perspective view of an electronic device of FIGS. 2A and 2B according to an embodiment of the disclosure.

Referring to FIG. 3, an electronic device 300 may include a side bezel structure 310, a first support member 311 (e.g., a bracket), a front plate 320, a display 330, a printed circuit board 340, a battery 350, a second support member 360 (e.g., a rear case), an antenna 370, and a rear plate 380. In any embodiment, the electronic device 300 may not include at least one (e.g., the first support member 311 or the second support member 360) of the components or may further include any other component. At least one of the components of the electronic device 300 may be similar to or the same as at least one of the components of the electronic device 200 of FIG. 2A or 2B. Thus, additional description will be omitted to avoid redundancy.

The first support member 311 may be disposed in the electronic device 300 so as to be connected with the side bezel structure 310, or may be integrally formed with the side bezel structure 310. The first support member 311 may be formed of, for example, a metal material and/or a nonmetal material (e.g., polymer). The display 330 may be coupled with one surface of the first support member 311, and the printed circuit board 340 may be coupled with an opposite surface of the first support member 311. A processor, a memory, and/or an interface may be mounted on the printed circuit board 340. For example, the processor may include one or more of a central processing unit, an application processor, a graphic processing device, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, a secure digital (SD) card interface, and/or an audio interface. The interface may electrically or physically connect, for example, the electronic device 300 with an external electronic device and may include a USB connector, an SD card/multimedia card (MMC) connector, or an audio connector.

The battery 350 that is a device for supplying power to at least one component of the electronic device 300 may include, for example, a primary cell incapable of being recharged, a secondary cell rechargeable, or a fuel cell. At least part of the battery 350 may be disposed on substantially the same plane as the printed circuit board 340, for example. The battery 350 may be integrally disposed within the electronic device 300, or may be disposed to be removable from the electronic device 300.

The antenna 370 may be interposed between the rear plate 380 and the battery 350. The antenna 370 may include, for example, a near field communication (NFC) antenna, an antenna for wireless charging, and/or a magnetic secure transmission (MST) antenna. For example, the antenna 370 may perform short range communication with an external device or may wirelessly transmit/receive power necessary for charging. In another embodiment, an antenna structure may be formed by a part of the first support member 311 and/or the side bezel structure 310, or by a combination thereof.

Figure 4:
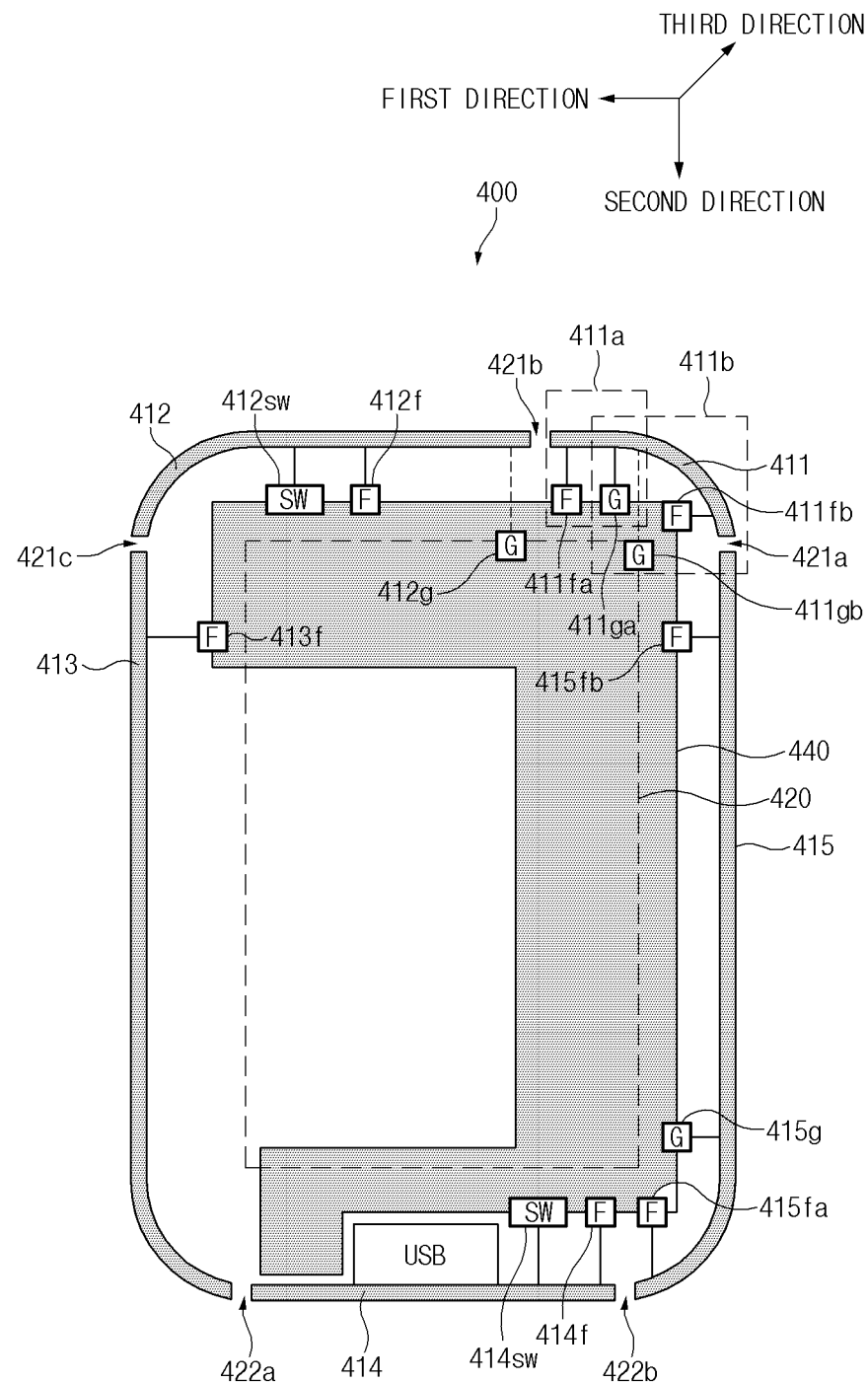
FIG. 4 is a diagram illustrating an antenna structure included in an electronic device, according to an embodiment of the disclosure.

FIG. 4 is a diagram illustrating an antenna structure included in an electronic device, according to an embodiment of the disclosure.

Referring to FIG. 4, an electronic device 400 may include a side bezel structure (e.g., the side bezel structure (218 or 310)) including a plurality of segments. For example, the side bezel structure of the electronic device 400 may be divided through two or more segments. For example, the side bezel structure may include a first conductive portion 411 divided by a first segment 421a and a second segment 421b, a second conductive portion 412 divided by the second segment 421b and a third segment 421c, a third conductive portion 413 divided by the third segment 421c and a fourth segment 422a, a fourth conductive portion 414 divided by the fourth segment 422a and a fifth segment 422b, or a fifth conductive portion 415 divided by the fifth segment 422b and the first segment 421a.

According to an embodiment, at least one of the conductive portions 411, 412, 413, 414, and 415 may be electrically connected to a metal structure 420 included in a support member (e.g., the first support member 311 or a bracket). At least part of the metal structure 420 may be connected to a ground area of a printed circuit board 440 (e.g., the printed circuit board 340).

According to an embodiment, the conductive portions 411, 412, 413, 414, and 415 may be connected to feed parts 411fa, 411fb, 412f, 413f, 414f, 415fa, and 415fb. At least one of the conductive portions 411, 412, 413, 414, and 415 may be connected to at least one ground part 411ga, 411gb, 412g, and 415g. In an embodiment, some of the conductive portions 412 and 414 may be connected to switches 412sw and 414sw. A segment shape of a conductive portion and connection locations of a feed part or a ground part shown in FIG. 4 are examples, but not limited thereto.

According to an embodiment, one conductive portion may be included in a plurality of antennas. For example, the first conductive portion 411 may be included in a first antenna 411a or a second antenna 411b. For example, the first antenna 411a may include the first conductive portion 411, the first feed part 411fa, and the first ground part 411ga. The second antenna 411b may include the first conductive portion 411, the second feed part 411fb, and the second ground part 411gb. The first ground part 411ga may be connected to a ground area of the printed circuit board 440. The second ground part 411gb may be connected to the metal structure 420.

According to an embodiment, the first antenna 411a and the second antenna 411b may use frequency bands adjacent to each other. For example, the first antenna 411a may use a first center frequency (e.g., about 2.5 gigahertz (GHz)). The second antenna 411b may use a second center frequency (e.g., about 2.4 GHz). When the first antenna 411a and the second antenna 411b, which use adjacent frequency bands (or commonly using one conductive portion and having a similar antenna length), commonly use one ground part, the radiation efficiency of the first antenna 411a and the second antenna 411b may be deteriorated due to mutual interference (e.g., a current applied from the first feed part 411fa leaks to the second feed part 411fb).

The first antenna 411a and the second antenna 411b according to an embodiment of the disclosure may be respectively grounded through paths that are physically separated from each other. For example, the first ground part 411ga may be connected to a ground area of the printed circuit board 440 through a first ground path (e.g., a clip-shaped electrical connection member). The second ground part 411gb may be connected to the metal structure 420 through a second ground path (e.g., a conductive member, which is integrated with the first conductive portion 411 or the metal structure 420 and has a thickness and width, each of which is not less than a specific size). In an embodiment, the ground area of the printed circuit board 440 may be electrically connected to the metal structure 420.

According to various embodiments, the first antenna 411a including the first feed part 411fa and the first ground part 411ga may be used as a mid-band antenna (e.g., about 1.7 GHz to 2.2 GHz), a high-band antenna (e.g., about 2.2 GHz to 3.5 GHz), or a global positioning system (GPS) antenna. The second antenna 411b including the second feed part 411fb and the second ground part 411gb may be used as a wireless fidelity (Wi-Fi) antenna (e.g., 2.4 GHz or 5 GHz). A third antenna (not shown) including the third feed part 412f and the third ground part 412g may be used as a low-band antenna (e.g., about 700 MHz to 1 GHz) or a wide-band antenna (e.g., about 3.1 GHz to 10.6 GHz). A fourth antenna (not shown) including the fourth feed part 413f may be used as a mid-band or high-band antenna. A fifth antenna (not shown) including the fifth feed part 414f may be used as a low-band or mid-band antenna. A sixth antenna (not shown) including the sixth feed part 415fa and the sixth ground part 415g may be used as a mid-band or high-band antenna. A seventh antenna (not shown) including the seventh feed part 415fb may be used as a Wi-Fi antenna (e.g., 5 GHz). However, a target frequency of each antenna is an example and not limited thereto.

According to various embodiments, the length of the third antenna including the first switch 412sw and/or the length of the fifth antenna including the second switch 414sw may be adjusted through the switch; and, the third antenna including the first switch 412sw and/or the fifth antenna including the second switch 414sw may be used in various frequency bands by adjusting an antenna length. The third ground part 412gl of the third antenna may be electrically connected to the metal structure 420.

Figure 5A:
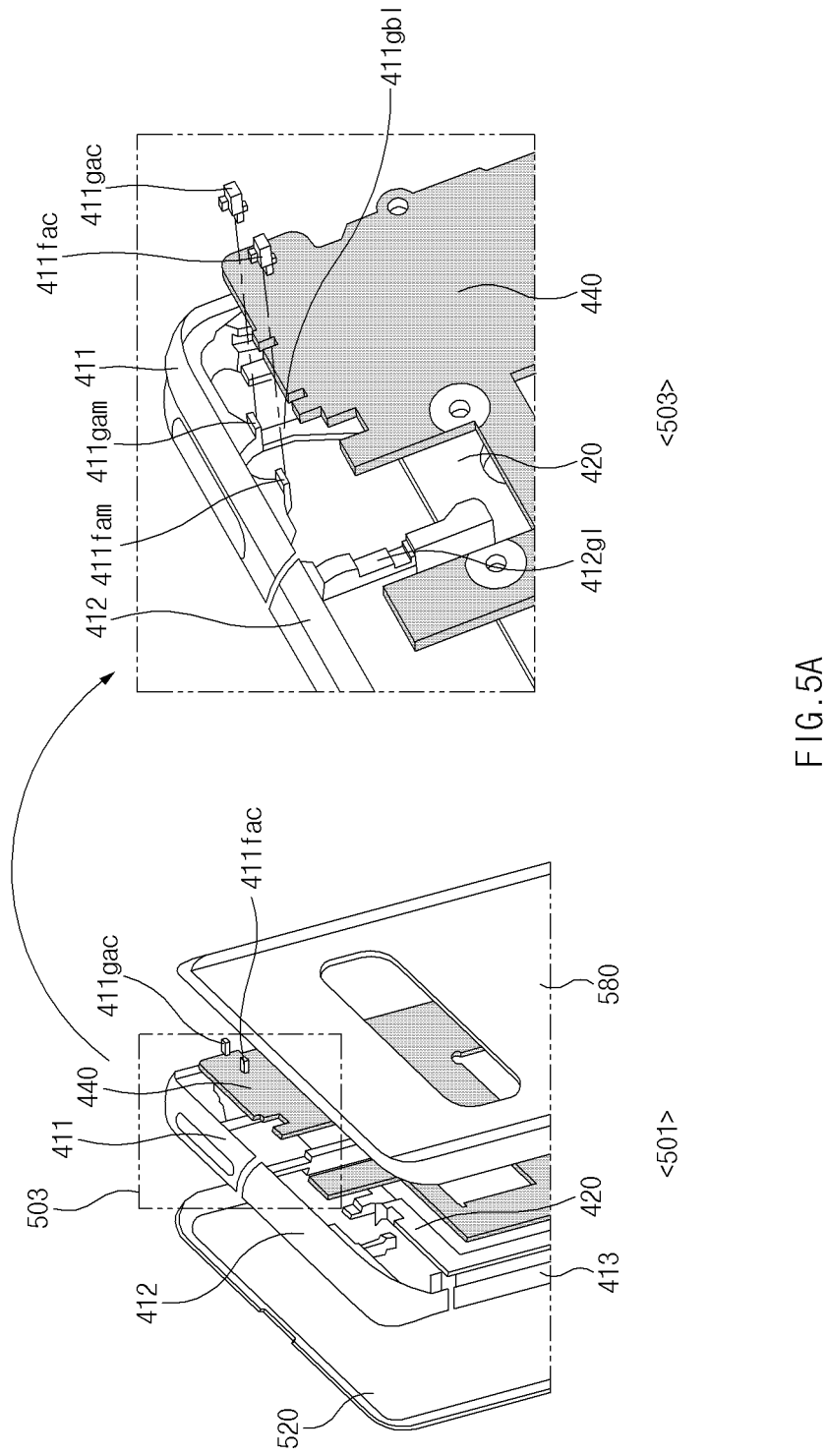
FIG. 5A is an exploded perspective view illustrating structures of a first feed part and a first ground part of a first antenna, according to an embodiment of the disclosure.

FIG. 5A is an exploded perspective view illustrating structures of a first feed part (e.g., the first feed part 411fa) and a first ground part (e.g., the first ground part 411ga) of a first antenna (e.g., the first antenna 411a), according to an embodiment of the disclosure.

Figure 5B:
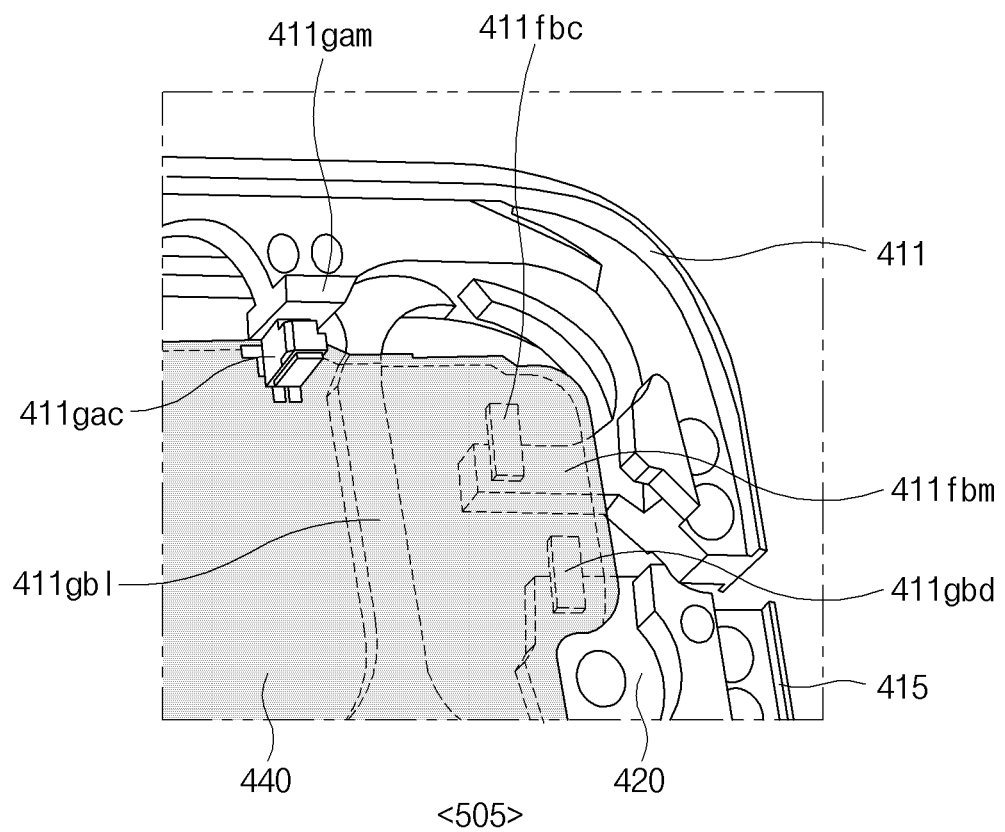
FIG. 5B is a perspective view illustrating structures of a second feed part and a second ground part of a second antenna, according to an embodiment of the disclosure.

FIG. 5B is a perspective view illustrating structures of a second feed part (e.g., the second feed part 411fb) and a second ground part (e.g., the second ground part 411gb) of a second antenna (e.g., the second antenna 411b), according to an embodiment of the disclosure.

Referring to FIGS. 5A and 5B, reference numeral 503 and reference numeral 505 illustrate a portion of a drawing in reference numeral 501 (e.g., the first conductive portion 411) in detail.

According to an embodiment, the metal structure 420, which is integrally formed with or connected to a support member (e.g., the first support member 311 or a bracket) and a side bezel structure (e.g., the side bezel structure 310) including the first conductive portion 411, and conductive portions 412 and 413 may be interposed between a first plate 520 (e.g., the front plate 320) and the printed circuit board 440. A display (e.g., the display 330) may be interposed between the metal structure 420 and the first plate 520. The printed circuit board 440 may be interposed between the metal structure 420 and a second plate 580 (e.g., the rear plate 380).

According to an embodiment, in reference numeral 503, the first conductive portion 411 may include a first conductive member 411fam and a second conductive member 411gam. For example, a first connection member 411fac may electrically connect the first conductive member 411fam to a wireless communication circuit (e.g., the wireless communication module 192) mounted on the printed circuit board 440. A second connection member 411gac may electrically connect the second conductive member 411gam to a ground area of the printed circuit board 440.

According to various embodiments, the first connection member 411fac and the second connection member 411gac may be formed of a clip-shaped connection member. For example, the first connection member 411fac and the second connection member 411gac may be disposed on a part of the printed circuit board 440. The first connection member 411fac and the second connection member 411gac may be interposed between the first conductive portion 411 and the printed circuit board 440. For example, the first connection member 411fac and the second connection member 411gac may be disposed at edges of the printed circuit board 440. Contact terminals of the first connection member 411fac and the second connection member 411gac may protrude in a direction (e.g., a direction opposite to the second direction) parallel to the second plate 580 (or the printed circuit board 440). The first conductive member 411fam and the second conductive member 411gam may include portions formed to contact the contact terminals of the first connection member 411fac and the second connection member 411gac. According to various embodiments, the first conductive member 411fam, the second conductive member 411gam, the first connection member 411fac, and the second connection member 411gac may be disposed on the same plane as the printed circuit board 440.

According to an embodiment, in reference numeral 505, the first conductive portion 411 may include a third conductive member 411fbm. For example, a third connection member 411fbc may electrically connect the third conductive member 411fbm and a wireless communication circuit (e.g., the wireless communication module 192) mounted on the printed circuit board 440. A conductive connection member 411gbl may electrically connect the first conductive portion 411 and the metal structure 420 and the metal structure 420 may be electrically connected to a ground area of the printed circuit board 440 through a connection member 411gbd.

According to various embodiments, the third connection member 411*fbc* may be formed as a clip-shaped connection member. For example, the third connection member 411*fbc* may be disposed on a part of the printed circuit board 440. The third connection member 411*fbc* may be interposed between the first conductive portion 411 and the printed circuit board 440. For example, the third connection member 411*fbc* may be disposed on one side of the printed circuit board 440. A contact terminal of the third connection member 411*fbc* may be disposed in a direction opposite to the printed circuit board 440 (e.g., a third direction). To contact the contact terminal of the third connection member 411*fbc*, the third conductive member 411*fbm* may be formed to protrude from the first conductive portion 411.

According to various embodiments, the conductive connection member 411*gbl* may be integrated with the conductive portion 411 or the metal structure 420, and may include a conductive member having a thickness and a width, each of which is not less than a specific size. The conductive connection member 411*gbl* may be integrated with the first conductive portion 411 or the metal structure 420. Alternatively, after the first conductive portion 411 and the metal structure 420 are disposed, the conductive connection member 411*gbl* may be formed to connect the first conductive portion 411 and the metal structure 420.

Figure 6:
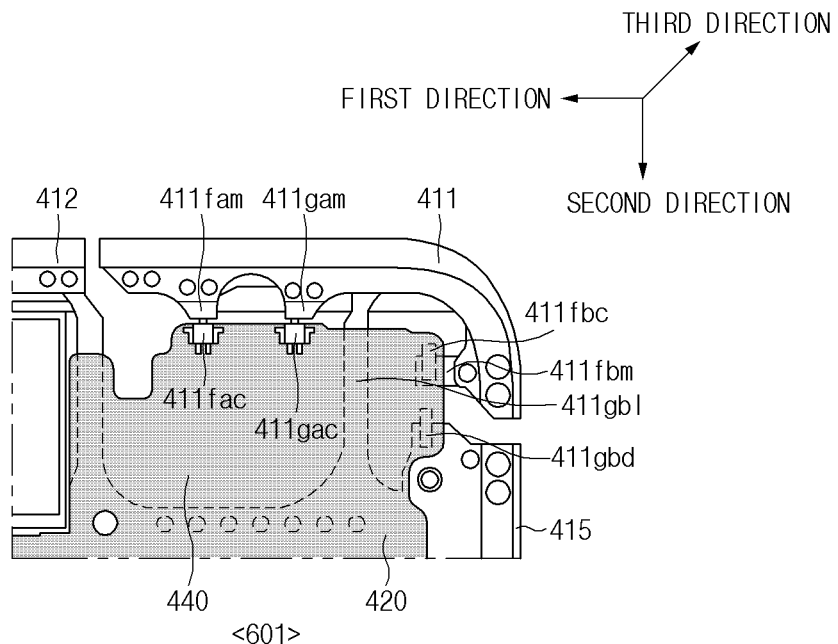
FIG. 6 is a plan view illustrating a connection structure of a feed part and a ground part of a plurality of antennas in an antenna structure, in which the plurality of antennas commonly use one conductive portion, according to an embodiment of the disclosure.
Figure 6:
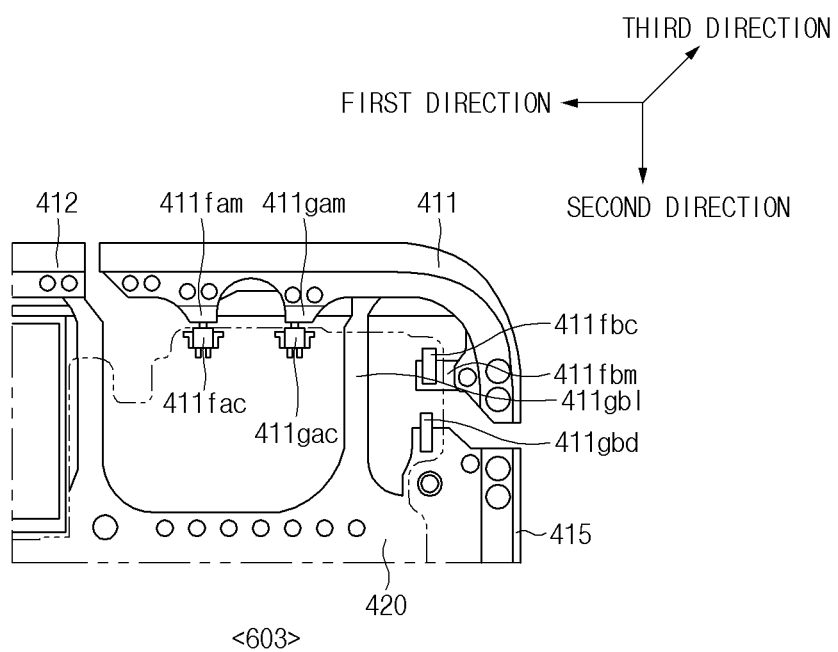

FIG. 6 is a plan view illustrating a connection structure of a feed part and a ground part of a plurality of antennas in an antenna structure, in which the plurality of antennas commonly use one conductive portion, according to an embodiment of the disclosure.

Figure 7:
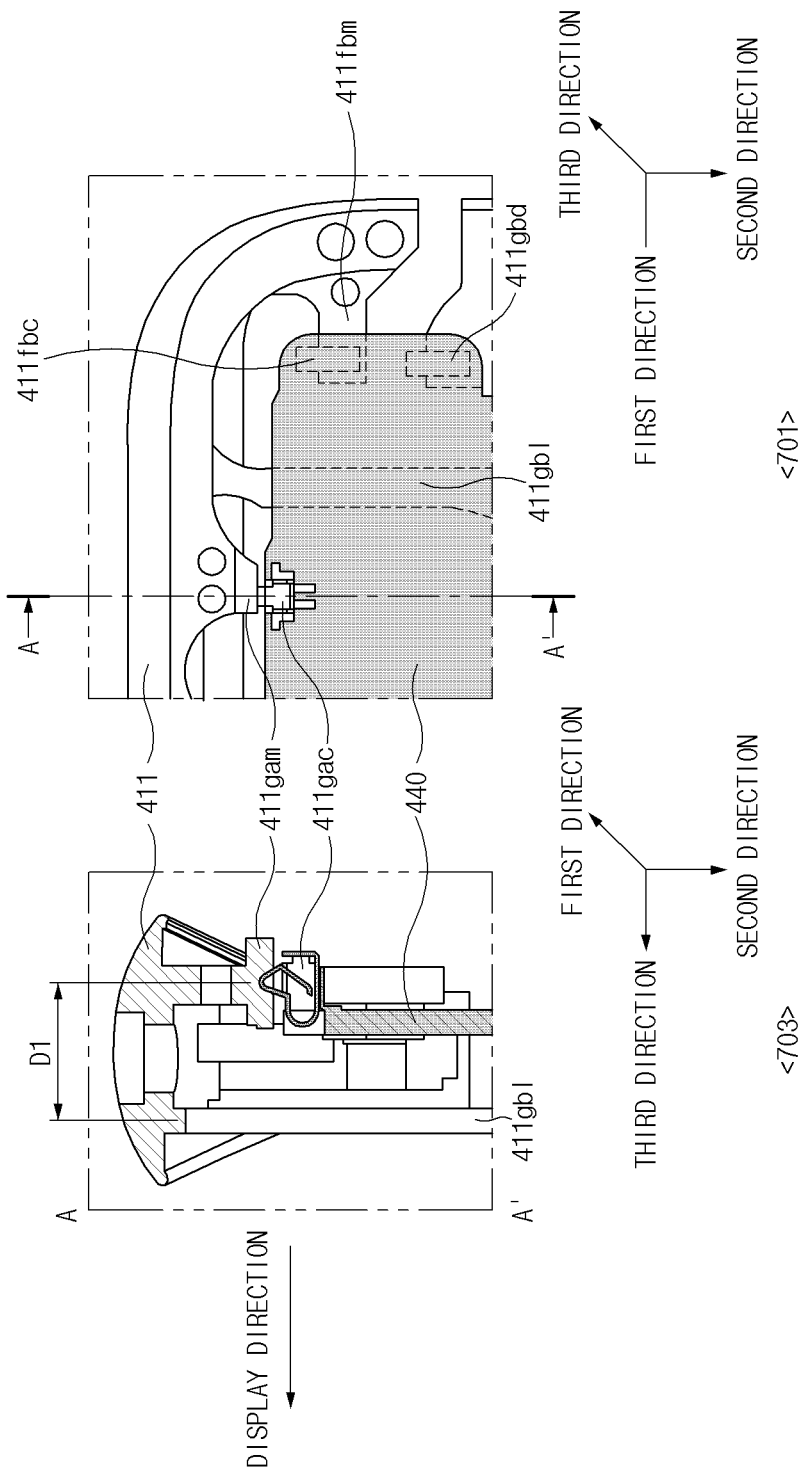
FIG. 7 is a cross-sectional view illustrating a connection structure of a ground part of a plurality of antennas in an antenna structure, in which the plurality of antennas commonly use one conductive portion, according to an embodiment of the disclosure.

FIG. 7 is a cross-sectional view illustrating a connection structure of a ground part of a plurality of antennas in an antenna structure, in which the plurality of antennas commonly use one conductive portion, according to an embodiment of the disclosure.

Referring to FIG. 6, reference numeral 601 denotes a placement relationship of the first conductive portion 411, the metal structure 420, and the printed circuit board 440. Reference numeral 603 is shown by omitting the printed circuit board 440 from a drawing in reference numeral 601. The metal structure 420 and the printed circuit board 440 may be disposed to overlap each other in parallel. The first conductive portion 411 may be disposed on one side of the metal structure 420 or the printed circuit board 440.

Referring to FIG. 7, reference numeral 701 denotes a part of a drawing in reference numeral 601. Reference numeral 703 denotes a cross section taken along line A-A' in a drawing of reference numeral 701.

According to an embodiment, the first conductive portion 411 may be included in a plurality of antennas. For example, a first antenna (e.g., the first antenna 411*a*) may include the first conductive portion 411, a first feed part (e.g., the first feed part 411*fa*), and a first ground part (e.g., the first ground part 411*ga*). The first feed part may include the first conductive member 411*fam* and the first connection member 411*fac*. The first ground part may include the second conductive member 411*gam* and the second connection member 411*gac*. A second antenna (e.g., the second antenna 411*b*) may include the first conductive portion 411, a second feed part (e.g., the second feed part 411*fb*), and a second ground part (e.g., the second ground part 411*gb*). The second feed part may include the third conductive member 411*fbm* and the third connection member 411*fbc*. The second ground part may include the conductive connection member 411*gbl*.

According to an embodiment, each of the first connection member 411*fac* and the second connection member 411*gac* may include a clip-shaped electrical connection member (e.g., a side clip). For example, the first connection member 411*fac* and the second connection member 411*gac* may be disposed on a part of the printed circuit board 440. The first connection member 411*fac* and the second connection member 411*gac* may be interposed between the first conductive portion 411 and the printed circuit board 440. For example, the first connection member 411*fac* and the second connection member 411*gac* may be disposed on a portion of an edge of the printed circuit board 440. In an embodiment, contact terminals of the first connection member 411*fac* and the second connection member 411*gac* may protrude in a direction opposite to the second direction (e.g., a direction perpendicular to the display direction). The first conductive member 411*fam* may include a portion formed to contact the contact terminal of the first connection member 411*fac*. The second conductive member 411*gam* may include a portion formed to contact the contact terminal of the second connection member 411*gac*.

According to an embodiment, the third connection member 411*fbc* may include a clip-shaped electrical connection member (e.g., C-clip). For example, the third connection member 411*fbc* may be disposed on a part of the printed circuit board 440. The third connection member 411*fbc* may be interposed between the first conductive portion 411 and the printed circuit board 440. For example, the third connection member 411*fbc* may be disposed on one side of the printed circuit board 440. A contact terminal of the third connection member 411*fbc* may be disposed in a third direction (e.g., the opposite direction of the printed circuit board 440). The third conductive member 411*fbm* may be formed in a first direction (e.g., a direction parallel to one side of the printed circuit board 440). The third conductive member 411*fbm* may be formed to protrude toward the inside of the housing (e.g., the housing 210 in FIG. 2) to contact the contact terminal of the third connection member 411*fbc*. As another example, the conductive connection member 411*gbl* may be integrated with the first conductive portion 411 or the metal structure 420, and may include a conductive member having a thickness and a width, each of which is not less than a specific size. For example, the conductive connection member 411*gbl* may be formed together when the first conductive portion 411 or the metal structure 420 are formed, or may be formed after the first conductive portion 411 or the metal structure 420 is disposed.

According to various embodiments, the first antenna (e.g., the first antenna 411*a*) and the second antenna (e.g., the second antenna 411*b*) may be grounded through paths that are physically separated from each other. For example, the first antenna may be connected to a ground area of the printed circuit board 440 through the second conductive member 411*gam* and the second connection member 411*gac*. The second antenna may be connected to the metal structure 420 through the conductive connection member 411*gbl*. For example, a first ground path (e.g., the second conductive member 411*gam* and the second connection member 411*gac*) of the first antenna and a second ground path (e.g., the conductive connection member 411*gbl*) of the second antenna may be spaced from each other by a first distance D1 in the third direction (e.g., a display direction). When a plurality of antennas are included in one conductive portion, the antenna structure according to an embodiment of the disclosure may secure the isolation between antennas by using different ground paths (e.g., a first ground path and a second ground path) that are physically separated from each other in the third direction (e.g., a display direction).

According to various embodiments, the second conductive member 411gam may be closer to the second plate 580 than the conductive connection member 411gbl. For example, the conductive connection member 411gbl may be disposed spaced from the second conductive member 411gam by the first distance D1.

According to various embodiments, the second conductive member 411gam and the first conductive member 411fam may be located at a second distance from the second plate 580 in the third direction. As another example, the conductive connection member 411gbl and the third conductive member 411fbm may be located at a third distance from the second plate 580 in the third direction. For example, the second distance may be different from the third distance.

According to various embodiments, the metal structure 420 may be electrically connected to a ground area of the printed circuit board 440 through a connection member 411gbd. For example, the connection member 411gbd may include a clip-shaped electrical connection member (e.g., C-clip). The connection member 411gbd may be disposed on a part of the printed circuit board 440. The connection member 411gbd may be interposed between the metal structure 420 and the printed circuit board 440.

According to various embodiments, an electronic device (e.g., the electronic device 101, 200, 300, and 400) may include a housing (e.g., the housing 210) including a first plate (e.g., the front plate 320), a second plate (e.g., the rear plate 380) facing away from the first plate, and a side member (e.g., the side bezel structure 310) surrounding a space between the first plate and the second plate, a metal structure (e.g., the metal structure 420) of which a part is connected to the side member, and a printed circuit board (e.g., the printed circuit board 440) positioned between the metal structure and the second plate. The side member may include a first conductive portion (e.g., the first conductive portion 411), a second conductive portion (e.g., the fifth conductive portion 415) extending from one end of the first conductive portion, a third conductive portion (e.g., the second conductive portion 412) extending from the other end of the first conductive portion, a first segment (e.g., the first segment 421a) formed between the first conductive portion and the second conductive portion, and a second segment (e.g., the second segment 421b) formed between the first conductive portion and the third conductive portion. The first conductive portion may be connected to a first ground part (e.g., the first ground part 411ga) disposed on the printed circuit board through a first path, and is connected to a second ground part (e.g., the second ground part 411gb) disposed on the metal structure through a second path spaced from the first path by a specific distance (e.g., the first distance D1).

According to various embodiments, the first conductive portion may include a first feed part (e.g., the first feed part 411fa) formed between the first ground part and the second segment and transmitting and/or receiving a signal having a first frequency band, and a second feed part (e.g., the second feed part 411fb) formed between the second ground part and the first segment and transmitting and/or receiving a second signal having a second frequency band adjacent to the first frequency band.

According to various embodiments, the first ground part may be interposed between the first feed part and the second ground part.

According to various embodiments, the first feed part may include a first connection member (e.g., the first connection member 411fac) connected to the printed circuit board. The first ground part may include a second connection member (e.g., the second connection member 411gac) connected to the printed circuit board. The second feed part may include a third connection member (e.g., the third connection member 411fbc) connected to the printed circuit board. The second ground part may include a fourth connection member (e.g., the conductive connection member 411gbl) connected to the metal structure.

According to various embodiments, the first conductive portion may include a first conductive member connected to the first connection member, a second conductive member connected to the second connection member, and a third conductive member connected to the fourth connection member.

According to various embodiments, the first conductive member, the second conductive member, the first connection member, and the second connection member may be disposed spaced from the second plate by a first distance (e.g., the second distance of FIG. 7).

According to various embodiments, the third connection member may be disposed spaced from the second plate by a second distance (e.g., the third distance of FIG. 7) greater than the first distance.

According to various embodiments, the third conductive member may be interposed between the printed circuit board and the metal structure.

According to various embodiments, the fourth connection member may be interposed between the third conductive member and the printed circuit board.

According to various embodiments, the third connection member may be integrated with the conductive portion or the metal structure and is formed of a conductive member having a thickness and width, each of which is not less than a specific size.

According to various embodiments, the first connection member and the second connection member may be formed of a clip-shaped conductive member.

According to various embodiments, the first path may be interposed between the second plate and the metal structure. The second path may be interposed between the first plate and the printed circuit board.

According to various embodiments, the first path may be disposed more adjacent to the second plate than the second path.

According to various embodiments, the electronic device may further include a communication circuit electrically connected to at least one of the first conductive portion, the second conductive portion, and the third conductive portion.

According to various embodiments, an electronic device (e.g., the electronic device 101, 200, 300, and 400) may include a housing (e.g., the housing 210) including a first plate (e.g., the front plate 320), a second plate (e.g., the rear plate 380) facing away from the first plate, and a side member (e.g., the side bezel structure 310) surrounding a space between the first plate and the second plate, a metal structure (e.g., the metal structure 420) of which a part is connected to the side member, and a printed circuit board (e.g., the printed circuit board 440) positioned between the metal structure and the second plate. The side member may include a first conductive portion (e.g., the first conductive portion 411), a second conductive portion (e.g., the fifth conductive portion 415) extending from one end of the first conductive portion, a third conductive portion (e.g., the second conductive portion 412) extending from the other end of the first conductive portion, a first segment (e.g., the first segment 421a) formed between the first conductive portion and the second conductive portion, and a second segment (e.g., the second segment 421b) formed between the first conductive portion and the third conductive portion. The first conductive portion may be connected to a first ground part (e.g., the first ground part 411ga) disposed on the printed circuit board, and a second ground part (e.g., the second ground part 411gb) disposed on the metal structure. The first ground part may be disposed closer to the second plate than the second ground part.

According to various embodiments, the first conductive portion may include a first feed part (e.g., the first feed part 411fa) formed between the first ground part and the second segment and transmitting and/or receiving a signal having a first frequency band, and a second feed part (e.g., the second feed part 411fb) formed between the second ground part and the first segment and transmitting and/or receiving a second signal having a second frequency band adjacent to the first frequency band.

According to various embodiments, the first ground part may be interposed between the first feed part and the second ground part.

According to various embodiments, the first ground part may be connected to the first conductive portion through a first connection member (e.g., the second connection member 411gac) disposed spaced from the second plate by a first distance (e.g., the second distance of FIG. 7).

According to various embodiments, the second ground part may be connected to the first conductive portion through a second connection member (e.g., the conductive connection member 411gbl) disposed spaced from the second plate by a second distance (e.g., the third distance of FIG. 7) greater than the first distance.

According to various embodiments, the second ground part may be integrated with the conductive portion or the metal structure and is formed of a conductive member having a thickness and width, each of which is not less than a specific size.

Figure 8:
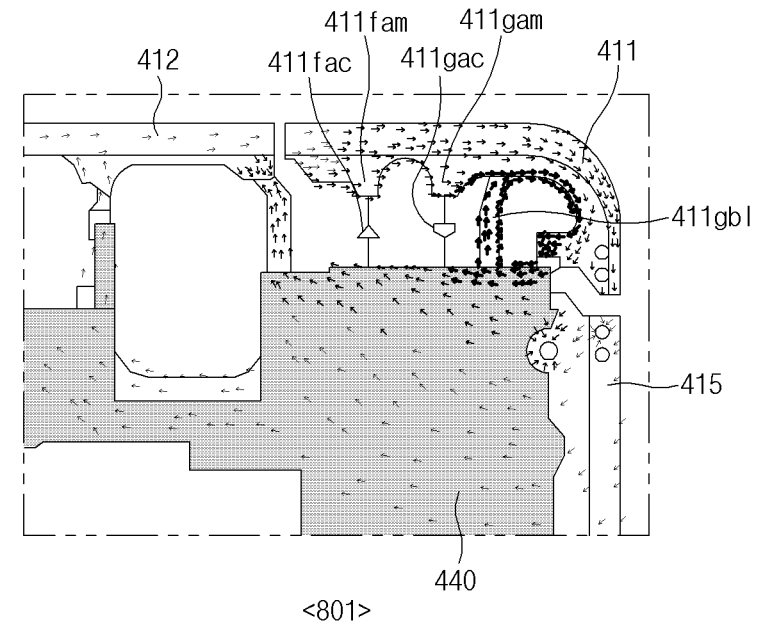
FIG. 8 is a diagram illustrating a radiation current when an antenna is operated, in an antenna structure in which a plurality of antennas commonly use one conductive portion, according to an embodiment of the disclosure.
Figure 8:
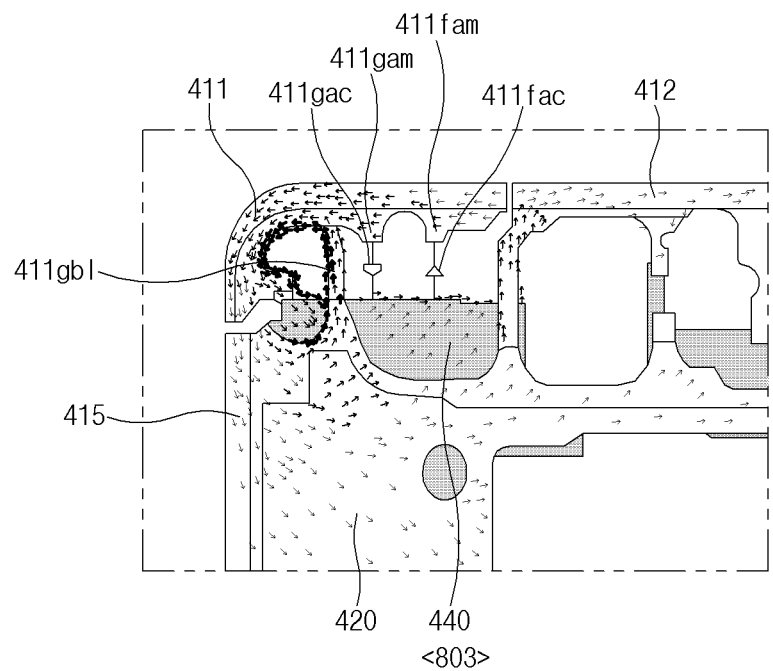

FIG. 8 is a diagram illustrating a radiation current when an antenna is operated, in an antenna structure in which a plurality of antennas commonly use one conductive portion, according to an embodiment of the disclosure. For example, FIG. 8 illustrates a radiation current in the first conductive portion 411, the metal structure 420, and the printed circuit board 440 when a first antenna (e.g., the first antenna 411a) and a second antenna (e.g., the second antenna 411b) that share the first conductive portion 411 are operated. Reference numeral 801 indicates a radiation current when viewed from the printed circuit board 440. Reference numeral 803 indicates a radiation current when viewed from the metal structure 420. In FIG. 8, a direction of an arrow indicates a direction of a current. A magnitude or density of the arrow indicates an amount of current.

Referring to FIG. 8, the isolation of a plurality of antennas (e.g., the first antenna and the second antenna) commonly using one conductive portion (e.g., the first conductive portion 411) may be secured.

According to an embodiment, when the first antenna is operated, a first radiation current may occur between a first feed part (e.g., the first conductive member 411fam and the first connection member 411fac) and a first ground part (e.g., the second conductive member 411gam and the second connection member 411gac) of the first antenna. When the second antenna is operated, a second radiation current may occur between a second feed part (e.g., the third conductive member 411fbm and the third connection member 411fbc) and a second ground part (e.g., the conductive connection member 411gbl) of the second antenna. When the first ground part in the first conductive portion 411 is used as a common ground of the first antenna and the second antenna (or when the second ground part connected to the metal structure 420 is not present), a leakage current may occur between the first antenna and the second antenna, and thus the antenna performance may be reduced. In various embodiments of the disclosure, the second radiation current by the second feed part may be distributed to the metal structure 420 through the conductive connection member 411gbl. Accordingly, the isolation of the first antenna and the second antenna may be secured.

Figure 9:
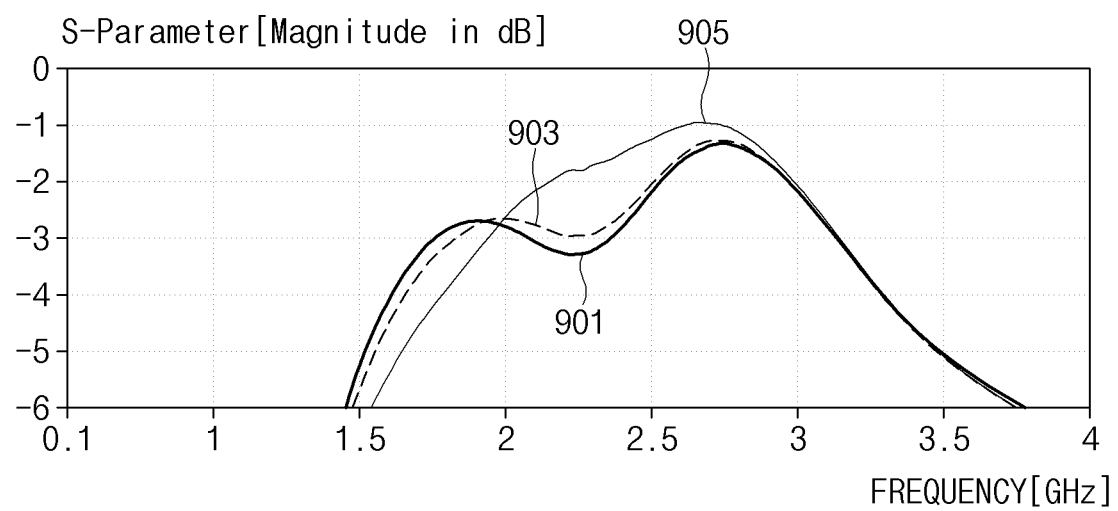
FIG. 9 is a graph illustrating radiation efficiency of a first antenna in an antenna structure in which a plurality of antennas commonly use one conductive portion, according to an embodiment of the disclosure.

FIG. 9 is a graph illustrating radiation efficiency of a first antenna (e.g., the first antenna 411a) in an antenna structure in which a plurality of antennas commonly use one conductive portion, according to an embodiment of the disclosure.

Referring to FIG. 9, graph 901 illustrates the radiation efficiency of the first antenna when one common ground part is used in two antennas (e.g., the first antenna 411a and the second antenna 411b) commonly using one conductive portion (e.g., the first conductive portion 411). Graph 903 illustrates the radiation efficiency of the first antenna when two ground parts connected to the printed circuit board (e.g., the printed circuit board 440) are used in two antennas (e.g., the first antenna 411a and the second antenna 411b) commonly using one conductive portion (e.g., the first conductive portion 411). Graph 905 illustrates the radiation efficiency of the first antenna when ground parts (e.g., the first ground part 411ga and the second ground part 411gb) of two paths spaced from each other in the third direction according to various embodiments of the disclosure are used in two antennas (e.g., the first antenna 411a and the second antenna 411b) commonly using one conductive portion (e.g., the first conductive portion 411).

According to an embodiment, FIG. 9 illustrates that the radiation efficiency of the graph 905 is improved as compared to the radiation efficiency of the graph 901 or the graph 903 in a target frequency band (e.g., about 2.3 GHz to 2.7 GHz) of the first antenna.

Figure 10:
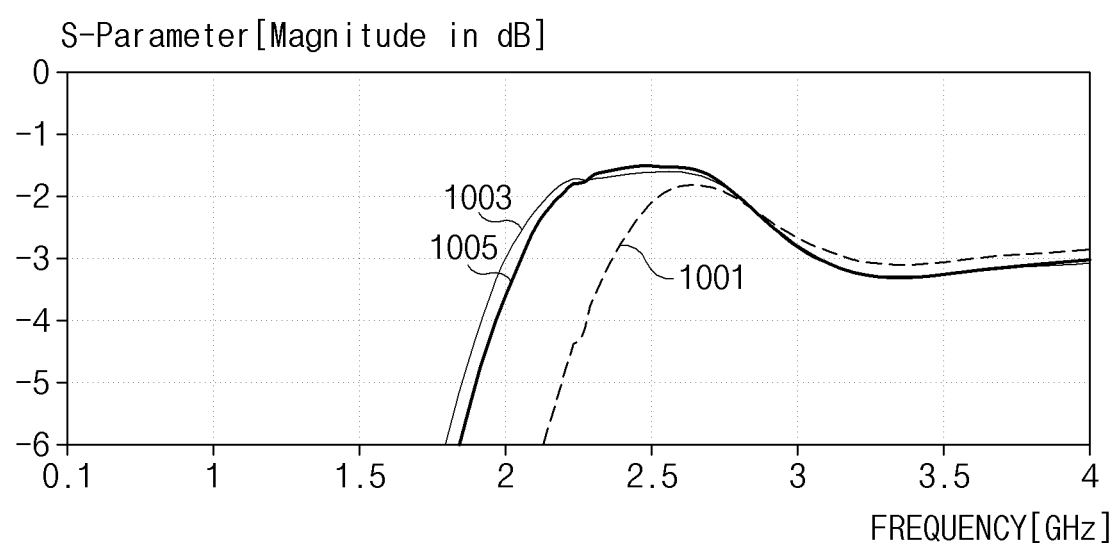
FIG. 10 is a graph illustrating radiation efficiency of a second antenna in an antenna structure in which a plurality of antennas commonly use one conductive portion, according to an embodiment of the disclosure.

FIG. 10 is a graph illustrating radiation efficiency of a second antenna (e.g., the second antenna 411b) in an antenna structure in which a plurality of antennas commonly use one conductive portion, according to an embodiment of the disclosure.

Referring to FIG. 10, graph 1001 illustrates the radiation efficiency of the second antenna when one common ground part is used in two antennas (e.g., the first antenna 411a and the second antenna 411b) commonly using one conductive portion (e.g., the first conductive portion 411). Graph 1003 illustrates the radiation efficiency of the second antenna when two ground parts connected to the printed circuit board (e.g., the printed circuit board 440) are used in two antennas (e.g., the first antenna 411a and the second antenna 411b) included in one conductive portion (e.g., the first conductive portion 411). Graph 1005 illustrates the radiation efficiency of the second antenna when ground parts (e.g., the first ground part 411ga and the second ground part 411gb) of two paths spaced from each other in the third direction according to various embodiments of the disclosure are used in two antennas (e.g., the first antenna 411a and the second antenna 411b) commonly using one conductive portion (e.g., the first conductive portion 411).

According to an embodiment, FIG. 10 illustrates that the radiation efficiency of the graph 1005 is improved as compared to the radiation efficiency of the graph 1001 or the graph 1003 in a target frequency band (e.g., about 2.3 GHz to 2.7 GHz) of the second antenna.

Figure 11:
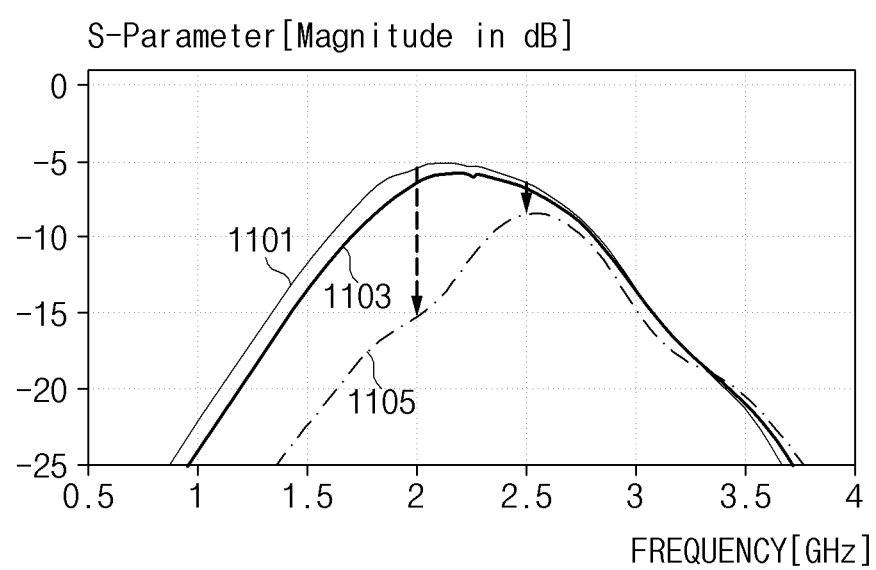
FIG. 11 is a graph illustrating an isolation effect of a plurality of antennas in an antenna structure, in which the plurality of antennas commonly use one conductive portion, according to an embodiment of the disclosure.

FIG. 11 is a graph illustrating an isolation effect of a plurality of antennas in an antenna structure, in which the plurality of antennas commonly use one conductive portion, according to an embodiment of the disclosure.

Referring to FIG. 11, graph 1101 illustrates the isolation between antennas when one common ground part is used in two antennas (e.g., the first antenna 411a and the second antenna 411b) commonly using one conductive portion (e.g., the first conductive portion 411). Graph 1103 illustrates the isolation between antennas when two ground parts connected to the printed circuit board (e.g., the printed circuit board 440) are used in two antennas (e.g., the first antenna 411a and the second antenna 411b) commonly using one conductive portion (e.g., the first conductive portion 411). Graph 1105 illustrates the isolation between antennas when ground parts (e.g., the first ground part 411ga and the second ground part 411gb) of two paths spaced from each other in the third direction according to various embodiments of the disclosure are used in two antennas (e.g., the first antenna 411a and the second antenna 411b) commonly using one conductive portion (e.g., the first conductive portion 411).

According to an embodiment, it may be seen that the isolation between antennas of the graph 1105 is improved as compared to the isolation between antennas of the graph 1101 or the graph 1103 in a target frequency band (e.g., about 2.3 GHz to 2.7 GHz) of two antennas (e.g., the first antenna 411a and the second antenna 411b).

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wired), wirelessly, or via a third element.

As used herein, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:
1. An electronic device comprising:
a housing including a first plate, a second plate facing away from the first plate, and a side member surrounding a space between the first plate and the second plate, the side member comprising a first conductive portion;

a metal structure comprising a first ground region, wherein a part of the metal structure is connected to the first conductive portion via a conductive connection member extending from the first conductive portion to the metal structure; and a printed circuit board comprising a second ground region and, when viewed from above the second plate, positioned between the metal structure and the second plate, wherein the first conductive portion comprises:
   the conductive connection member electrically connecting the first conductive portion to the first ground region, and
   a first conductive member electrically connecting the first conductive portion to the second ground region, and
wherein, when viewed from above the second plate, the conductive connection member and the first conductive member are spaced apart from each other and the first conductive member is closer to the second plate than the conductive connection member.

2. The electronic device of claim 1,
wherein the side member further comprises:
   a second conductive portion extending from a first segment,
   the first segment formed between the first conductive portion and the second conductive portion,
   a third conductive portion extending from a second segment, and
   the second segment formed between the first conductive portion and the third conductive portion,
wherein the first conductive portion includes:
   a first feed part formed between the conductive connection member and the second segment and configured to transmit or receive a first signal having a first frequency band, and
   a second feed part formed between the conductive connection member and the first segment and configured to transmit or receive a second signal having a second frequency band adjacent to the first frequency band.

3. The electronic device of claim 2, further comprising:
a communication circuit disposed on the printed circuit board, the communication circuit configured to:
   transmit and/or receive the first signal through the first feed part, and
   transmit and/or receive the second signal through the second feed part.

4. The electronic device of claim 2,
wherein the first feed part includes a first connection member connected to the printed circuit board, and
wherein the second feed part includes a second connection member connected to the printed circuit board.

5. The electronic device of claim 4, wherein the first conductive portion includes:
   the first conductive member connected to the first connection member, and
   a second conductive member connected to the second connection member.

6. The electronic device of claim 5, wherein the first conductive members and the second conductive member are disposed spaced from the second plate by a first distance.

7. The electronic device of claim 6, wherein the conductive connection member is disposed spaced from the second plate by a second distance greater than the first distance.

8. The electronic device of claim 5, wherein, when viewed from above the second plate, the conductive connection member is disposed under the printed circuit board.

9. The electronic device of claim 5,
wherein the conductive connection member is integrated with the first conductive portion or the metal structure.

10. The electronic device of claim 5, wherein the first connection member and the second connection member are formed of a clip-shaped conductive member.

* * * * *